United States Patent
Hsu

(10) Patent No.: US 11,569,252 B2
(45) Date of Patent: *Jan. 31, 2023

(54) METHOD FOR MANUFACTURING SEMICONDUCTOR STRUCTURE AND CAPABLE OF CONTROLLING THICKNESSES OF DIELECTRIC LAYERS

(71) Applicant: eMemory Technology Inc., Hsin-Chu (TW)

(72) Inventor: Te-Hsun Hsu, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 207 days.

This patent is subject to a terminal disclaimer.

(21) Appl. No.: 17/068,836

(22) Filed: Oct. 13, 2020

(65) Prior Publication Data

US 2021/0111180 A1  Apr. 15, 2021

Related U.S. Application Data

(60) Provisional application No. 62/915,619, filed on Oct. 15, 2019.

(51) Int. Cl.
| | |
|---|---|
| *H01L 27/115* | (2017.01) |
| *H01L 27/11531* | (2017.01) |
| *H01L 27/11524* | (2017.01) |
| *H01L 27/11529* | (2017.01) |
| *H01L 29/06* | (2006.01) |

(Continued)

(52) U.S. Cl.
CPC .. *H01L 27/11531* (2013.01); *H01L 27/11524* (2013.01); *H01L 27/11529* (2013.01); *H01L 29/0649* (2013.01); *H01L 29/66825* (2013.01); *H01L 29/7884* (2013.01)

(58) Field of Classification Search
CPC ......... H01L 27/11531; H01L 27/11524; H01L 27/11529; H01L 29/0649; H01L 29/66825; H01L 29/7884; H01L 27/088; H01L 29/7885; H01L 21/823462
See application file for complete search history.

(56) References Cited

U.S. PATENT DOCUMENTS 6,025,234 A     2/2000  Chou
6,979,616 B2 * 12/2005  Jang ................... H01L 27/1052
                                                         257/E21.654
(Continued)

FOREIGN PATENT DOCUMENTS

TW           529134           4/2003

*Primary Examiner* — Shouxiang Hu
(74) *Attorney, Agent, or Firm* — Winston Hsu

(57) ABSTRACT

A method for manufacturing a semiconductor structure includes forming a first dielectric layer on a substrate; forming a second dielectric layer on the first dielectric layer; using a photomask to apply a photoresist to cover a first part of the second dielectric layer; removing a second part of the second dielectric layer while retaining the first part of the second dielectric layer; and removing the photoresist. The first part of the second dielectric layer covers a first part of the first dielectric layer in a first area. The second part of the second dielectric layer covers a second part of the first dielectric layer in a second area. The first area is corresponding to a memory device. The second area is corresponding to a logic device.

12 Claims, 5 Drawing Sheets

(51) Int. Cl.
*H01L 29/66* (2006.01)
*H01L 29/788* (2006.01)

(56) References Cited

U.S. PATENT DOCUMENTS

| | | | |
|---|---|---|---|
| 7,670,913 B2 * | 3/2010 | Niimi | H01L 21/823857 |
| | | | 257/E21.01 |
| 2005/0079674 A1 | 4/2005 | Zheng | |
| 2007/0117391 A1 | 5/2007 | Kim | |
| 2008/0057645 A1 * | 3/2008 | Lin | H01L 27/11573 |
| | | | 438/257 |
| 2010/0120213 A1 | 5/2010 | Choi | |
| 2011/0244640 A1 * | 10/2011 | Lin | H01L 29/7833 |
| | | | 257/E21.294 |
| 2021/0111273 A1 * | 4/2021 | Sun | H01L 29/0649 |

* cited by examiner

METHOD FOR MANUFACTURING SEMICONDUCTOR STRUCTURE AND CAPABLE OF CONTROLLING THICKNESSES OF DIELECTRIC LAYERS

CROSS REFERENCE TO RELATED APPLICATIONS

The application claims priority to provisional Patent Application No. 62/915,619, filed 2019 Oct. 15, and incorporated herein by reference in its entirety.

BACKGROUND OF THE INVENTION

1. Field of the Invention

The disclosure is related to a method for manufacturing a semiconductor structure, and more particularly, a method for manufacturing a semiconductor structure and capable of controlling thicknesses of dielectric layers.

2. Description of the Prior Art

In a memory device, a program operation can be performed by pulling electrons into a gate terminal (e.g., a floating gate terminal) with the hot carrier injection (HEI) effect. An erase operation can be performed by pulling electrons out of a gate terminal with the Fowler-Nordheim (F-N) tunneling effect.

To properly perform a program operation and an erase operation, the thickness of a dielectric layer of the gate terminal should be well controlled. However, it is difficult to control the thickness of a dielectric layer.

When the dielectric layer is overly thick, it is difficult to pull electrons into or out of a gate terminal, and the program operation and the erase operation will fail.

When the dielectric layer is overly thin, electrons stored in the gate terminal will unexpectedly escape to generate leakage currents, and more defects will occur to worsen reliability.

As above, it has been a challenge to control the thickness of the dielectric layer of a memory device, and another challenge is to further consider a logic device.

A dielectric layer of a logic device should have a proper thickness according to an operation voltage of the logic voltage. However, when a logic device and a memory device are formed on the same wafer, the dielectric layer of the logic device may be formed along with the dielectric layer of the memory device. This will cause the dielectric layer of the memory device to be too thick or too thin.

For example, an additional thermal process may be performed to adjust the thickness of the dielectric layer of the memory device; however, this may affect the logic device to make the features of the logic device inaccurate.

Hence, a proper solution is in need to separately and properly control the thicknesses of dielectric layers of a memory device and a logic device.

SUMMARY OF THE INVENTION

An embodiment provides a method for manufacturing a semiconductor structure. The method includes forming a first dielectric layer on a substrate; forming a second dielectric layer on the first dielectric layer; using a photomask to apply a photoresist to cover a first part of the second dielectric layer; removing a second part of the second dielectric layer while retaining the first part of the second dielectric layer; and removing the photoresist. The first part of the second dielectric layer covers a first part of the first dielectric layer in a first area. The second part of the second dielectric layer covers a second part of the first dielectric layer in a second area. The first area is corresponding to a memory device. The second area is corresponding to a logic device.

These and other objectives of the present invention will no doubt become obvious to those of ordinary skill in the art after reading the following detailed description of the preferred embodiment that is illustrated in the various figures and drawings.

DETAILED DESCRIPTION

In order to separately and properly control the thicknesses of dielectric layers of a memory device and a logic device without unexpectedly deteriorating the features of the logic device, a method may be used according to an embodiment.

Figure 1:
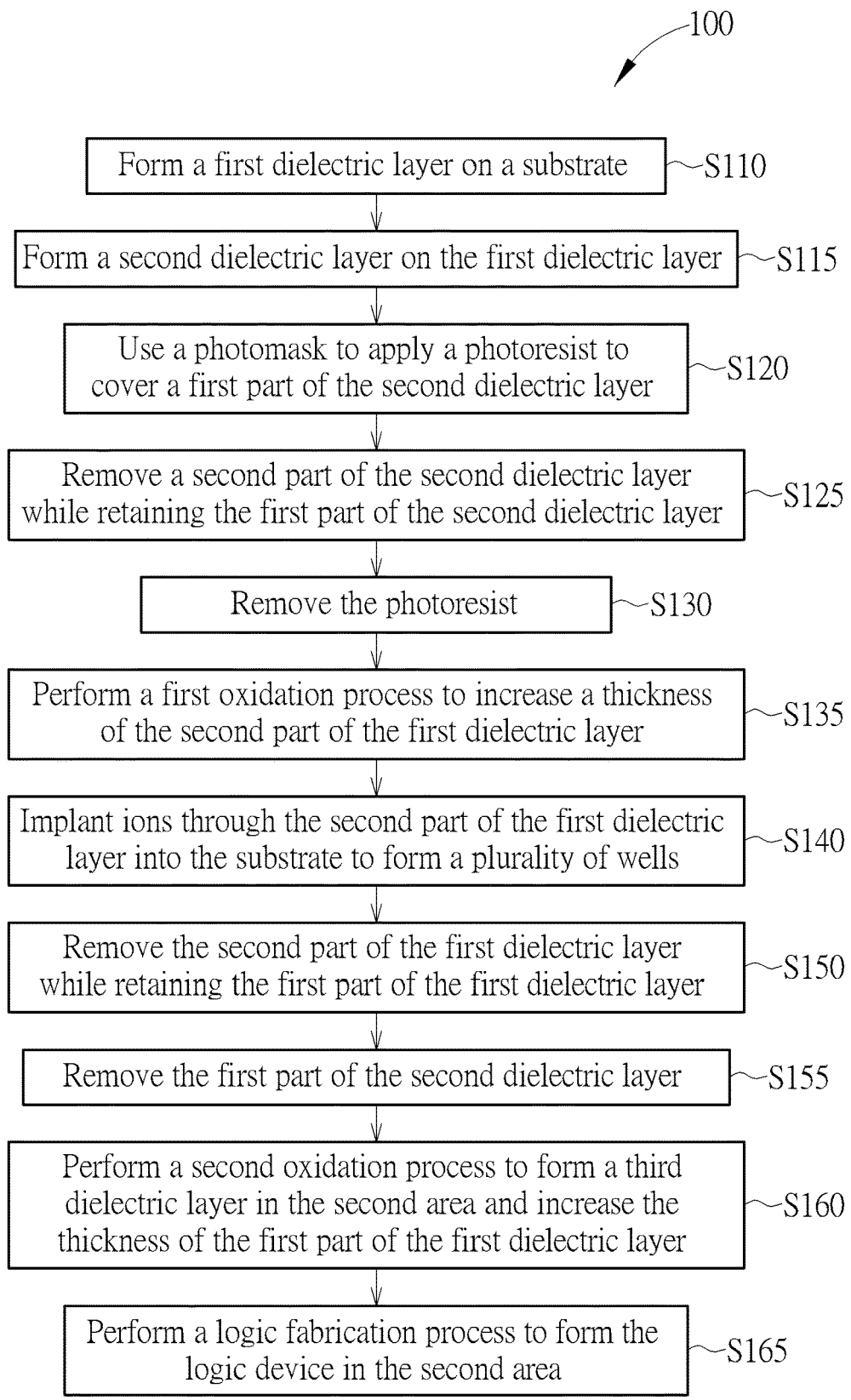
FIG. 1 is a flowchart of a method for manufacturing a semiconductor structure according to an embodiment.

FIG. 1 is a flowchart of a method 100 for manufacturing a semiconductor structure 1 according to an embodiment. FIG. 2 to FIG. 9 are cross sectional views during a manufacturing process of the semiconductor structure 1.

Figure 2:
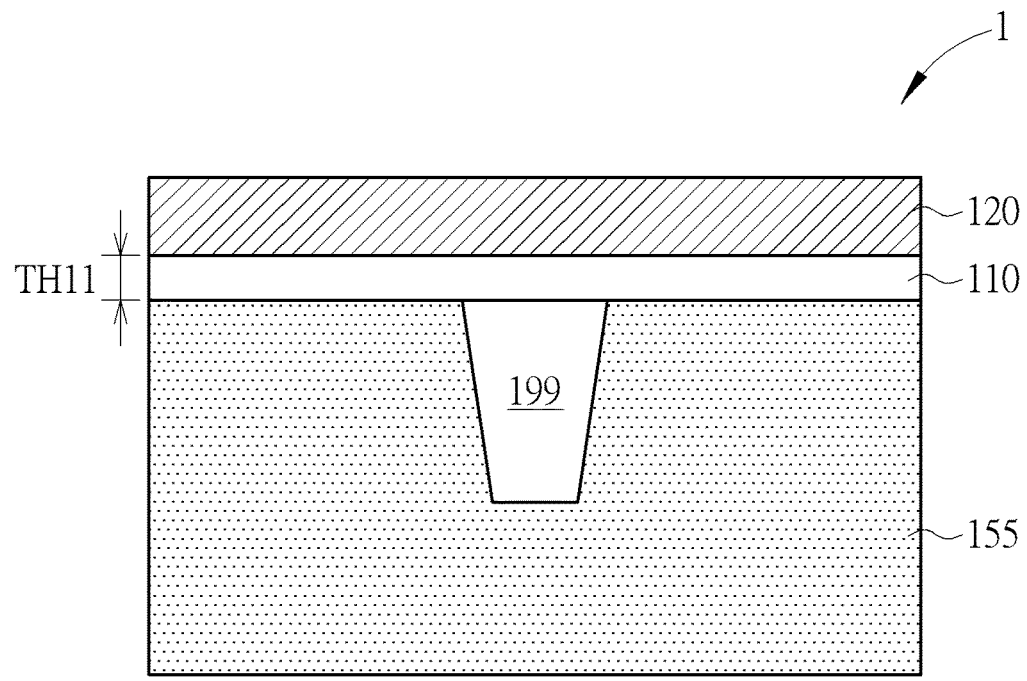
FIG. 2 to FIG. 9 are cross sectional views during a manufacture process of the semiconductor structure of FIG. 1.
Figure 3:
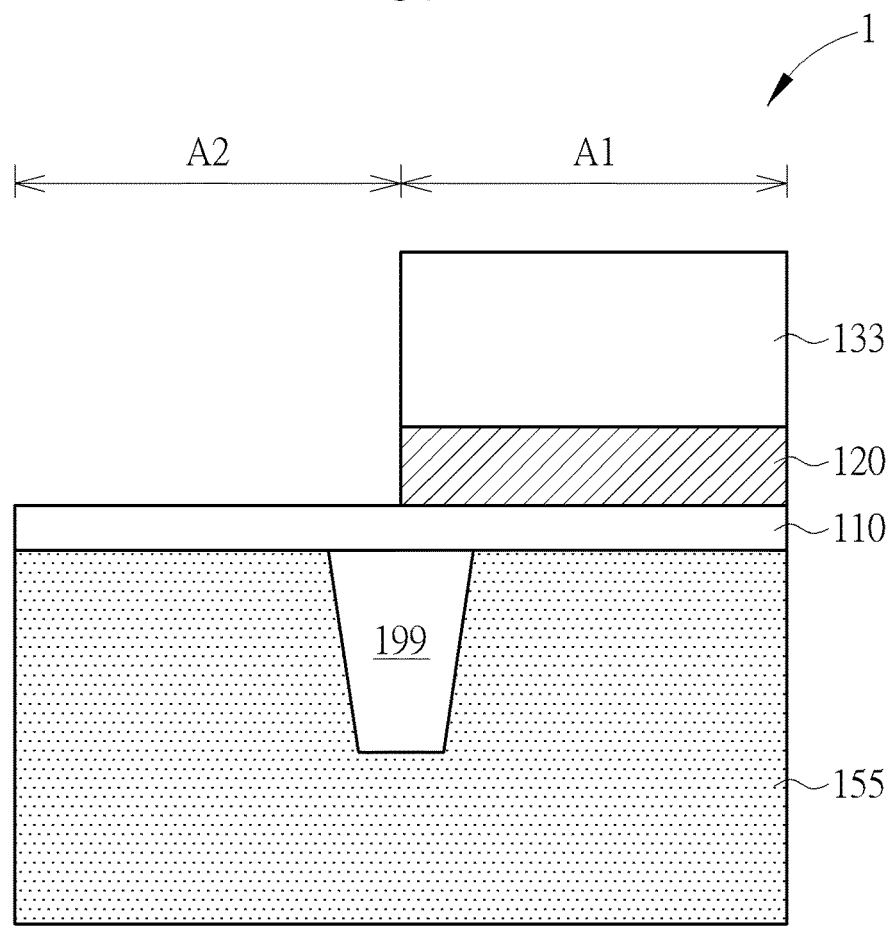

Steps S110 and S115 may be corresponding to FIG. 2. Steps S120 and S125 may be corresponding to FIG. 3. Step S130 may be corresponding to FIG. 4. Steps S135 to S140 may be corresponding to FIG. 5 or FIG. 6 according to different embodiments. Step S150 may be corresponding to FIG. 7. Step S155 may be corresponding to FIG. 8. Step S160 may be corresponding to FIG. 9.

In FIG. 2 to FIG. 9, a trench isolation region 199 is shown. The trench isolation region 199 may be a shallow trench isolation (STI) region and be formed before performing Step 110.

The method 100 may include the following steps.

S110: form a first dielectric layer 110 on a substrate 155;

S115: form a second dielectric layer 120 on the first dielectric layer 110;

S120: use a photomask to apply a photoresist 133 to cover a first part of the second dielectric layer 120;

S125: remove a second part of the second dielectric layer 120 while retaining the first part of the second dielectric layer 120;

S130: remove the photoresist 133;

S135: perform a first oxidation process to increase a thickness of the second part of the first dielectric layer 110;

S140: implant ions through the second part of the first dielectric layer 110 into the substrate 155 to form a plurality of wells;

S150: remove the second part of the first dielectric layer 110 while retaining the first part of the first dielectric layer 110;

S155: remove the first part of the second dielectric layer 120;

S160: perform a second oxidation process to form a third dielectric layer 130 in the second area A2 and increase the thickness of the first part of the first dielectric layer 110; and S165: perform a logic fabrication process to form the logic device in the second area A2.

Regarding FIG. 1 to FIG. 4 and Steps S110 to S130, the first part of the second dielectric layer 120 may cover the first part of the first dielectric layer 110 in the first area A1. The second part of the second dielectric layer 120 may cover the second part of the first dielectric layer 110 in the second area A2.

The first area A1 may be corresponding to a memory device, and the second area A2 may be corresponding to a logic device.

In other words, the memory device may be formed in the area A1, and the logic device may be formed in the area A2.

The first dielectric layer 110 may include a sacrificial oxide layer. The second dielectric layer 120 may include a silicon nitride layer composing, for example, $Si_3N_4$.

After performing Step S110, the first dielectric layer 110 may have a thickness TH11 smaller than the thickness of a typical sacrificial oxide layer. The thickness TH11 may be less than 100 Å. For example, the thickness TH11 may be approximately 40 Å.

Figure 5:
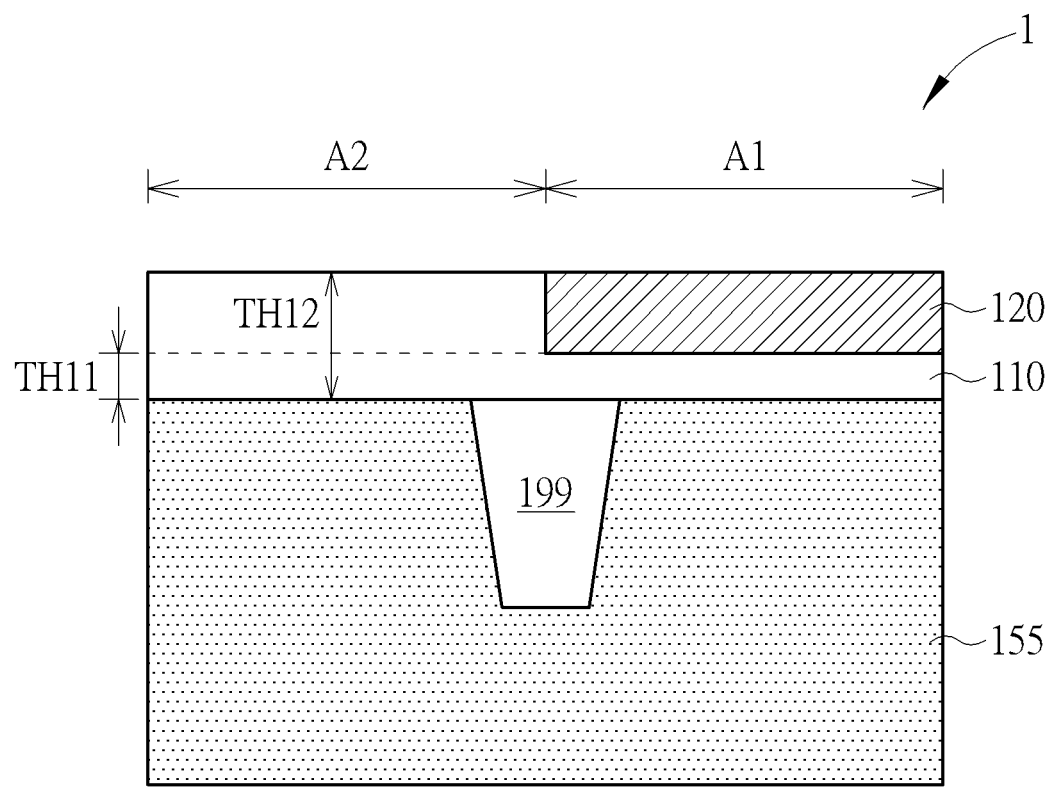
Figure 6:
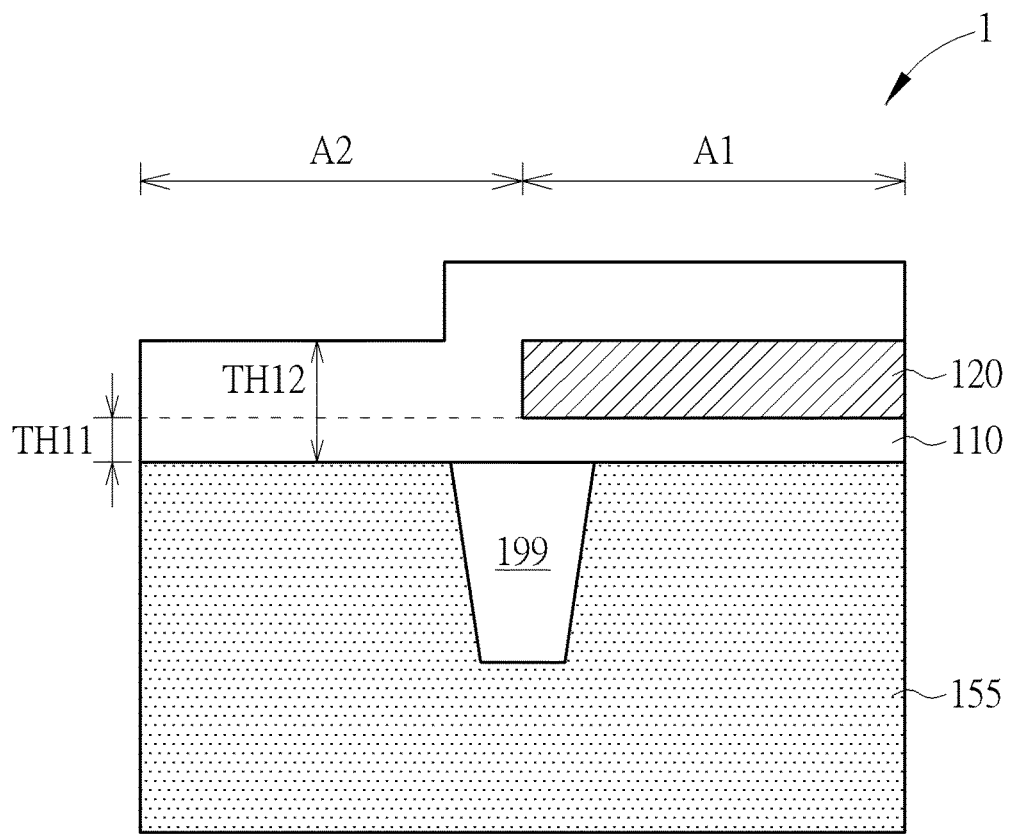

Regarding Step S135, as shown in FIG. 5 and FIG. 6, the thickness TH11 of the first part of the first dielectric layer 110 may be substantially maintained.

The first oxidation process in Step S135 may include one of a physical vapor deposition (PVD) process, a chemical vapor deposition (CVD) process, a plasma-enhanced chemical vapor deposition (PECVD) process and a thermal oxidation process.

According to an embodiment, as shown in FIG. 5, the first oxidation process may include a thermal oxidation process, and the newly generated oxide may be formed from the bottom of the second part of the first dielectric layer 110 to increase the thickness of the second part of the first dielectric layer 110 from the thickness TH11 to the thickness TH12.

As shown in FIG. 5, by using the thermal oxidation process, no oxide is effectively formed on the second dielectric layer 120 in the first area A1.

Unlike FIG. 5, according to another embodiment, in FIG. 6, the first oxidation process may include a deposition oxidation process such as (but not limited to) a CVD process. The newly generated oxide may be formed from top of the second part of the first dielectric layer 110 to increase the thickness of the second part of the first dielectric layer 110 from the thickness TH11 to the thickness TH12.

As shown in FIG. 6, by using the deposition oxidation process, when oxide is formed on the second part of the first dielectric layer 110, oxide may also be formed on the second dielectric layer 120 in the first area A1.

Figure 4:
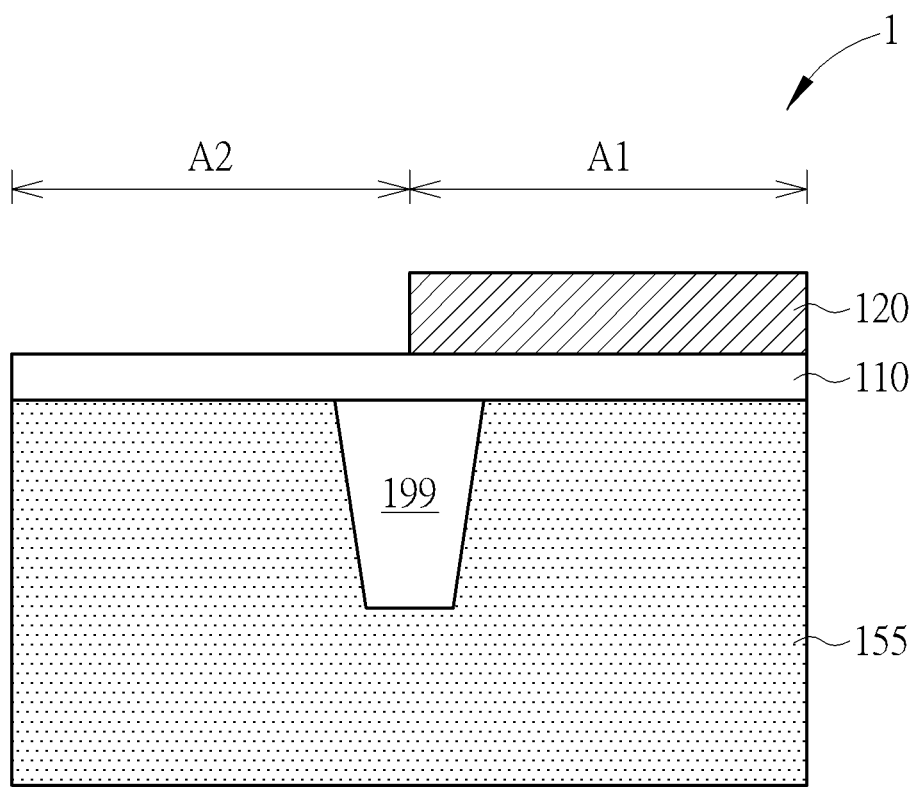

In FIG. 5 and FIG. 6, the dotted lines are used to distinguish an original dielectric layer 110 (as shown in FIG. 4) and a newly generated dielectric layer formed in Step S135. However, the dotted lines are merely used for explaining the manufacture process. As described above, the original dielectric layer 110 (as shown in FIG. 4) may be merged with the newly generated dielectric layer to form a thicker dielectric layer, and there may not be a clear boundary between the original dielectric layer 110 (as shown in FIG. 4) and the newly generated dielectric layer formed in Step S135.

After performing Step S135, the second part of the first dielectric layer 110 may have the thickness TH12, and the thickness TH12 may be substantially an applicable thickness of a typical sacrificial oxide layer.

In other words, in Step S110 and FIG. 2, the first dielectric layer 110 may be made thinner than a typical sacrificial oxide layer in advance. Afterward, in Step S135, the thickness of the first dielectric layer 110 in the second area A2 may be increased to be the thickness of a typical sacrificial oxide layer.

Figure 7:
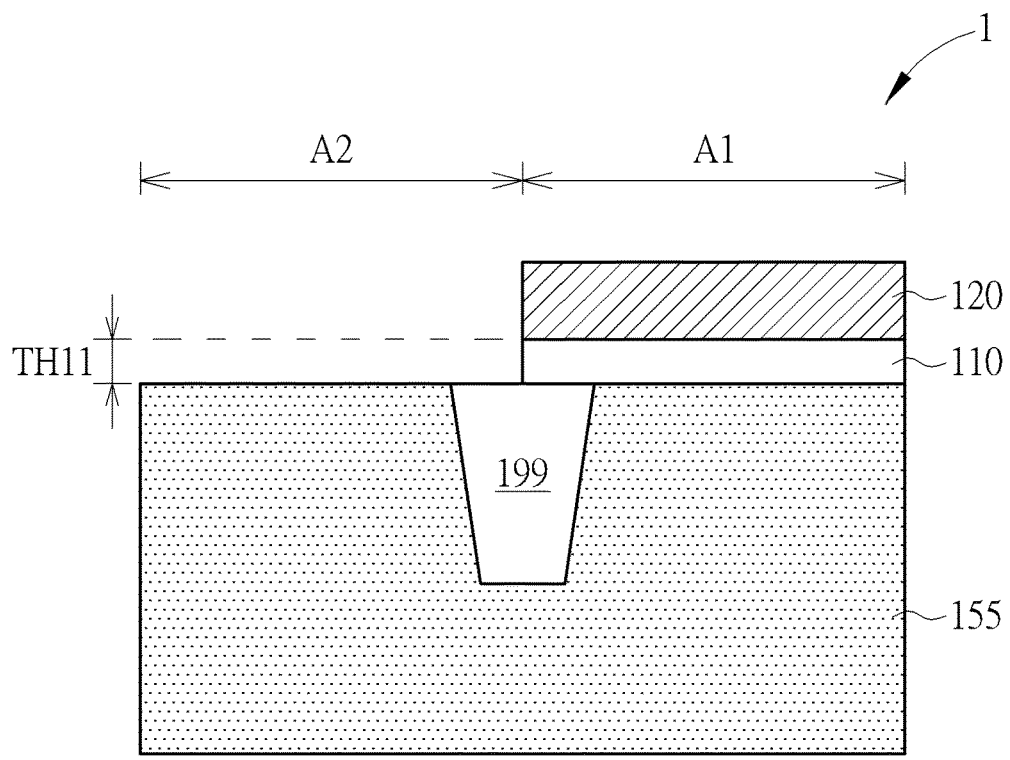

Between FIG. 5 and FIG. 7 or between FIG. 6 and FIG. 7, Step S140 may be performed. During Step S140, the ions may be implanted through the second part of the first dielectric layer 110 (having the thickness TH12). The second part of the first dielectric layer 110 in the second area A2 may thus be used as a sacrificial oxide layer to reduce damages caused by ion implantation.

As for the first part of the first dielectric layer 110 retained under the second dielectric layer 120 in the first area A1, it may be used to form a thicker dielectric layer for the memory device as mentioned below.

Regarding Step S150 and FIG. 7, the second part of the first dielectric layer 110 in the second area A2 may be removed for removing a used sacrificial oxide layer.

For example, hydrofluoric acid (e.g., HF) or other suitable chemicals may be used to perform an etching process to remove the second part of the first dielectric layer 110.

In the first area A1, the first part of the first dielectric layer 110 may be covered by the first part of the second dielectric layer 120.

Figure 8:
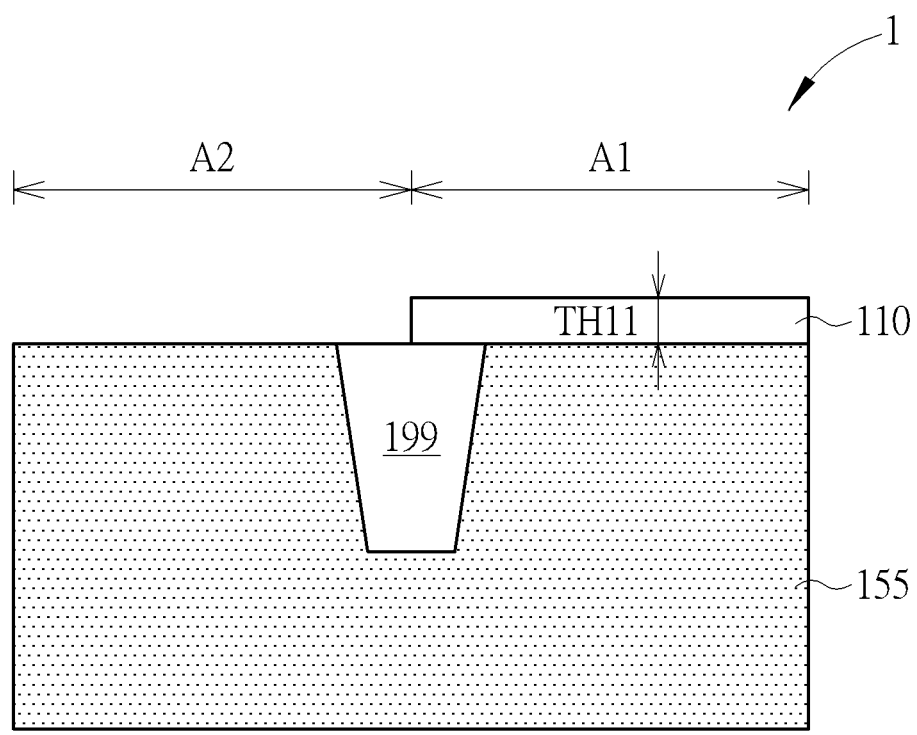

Regarding Step S155 and FIG. 8, the first part of the second dielectric layer 120 may be removed by performing an etching process. For example, phosphoric acid (e.g., $H_3PO_4$) or other suitable chemicals may be used to remove the second dielectric layer.

Figure 9:
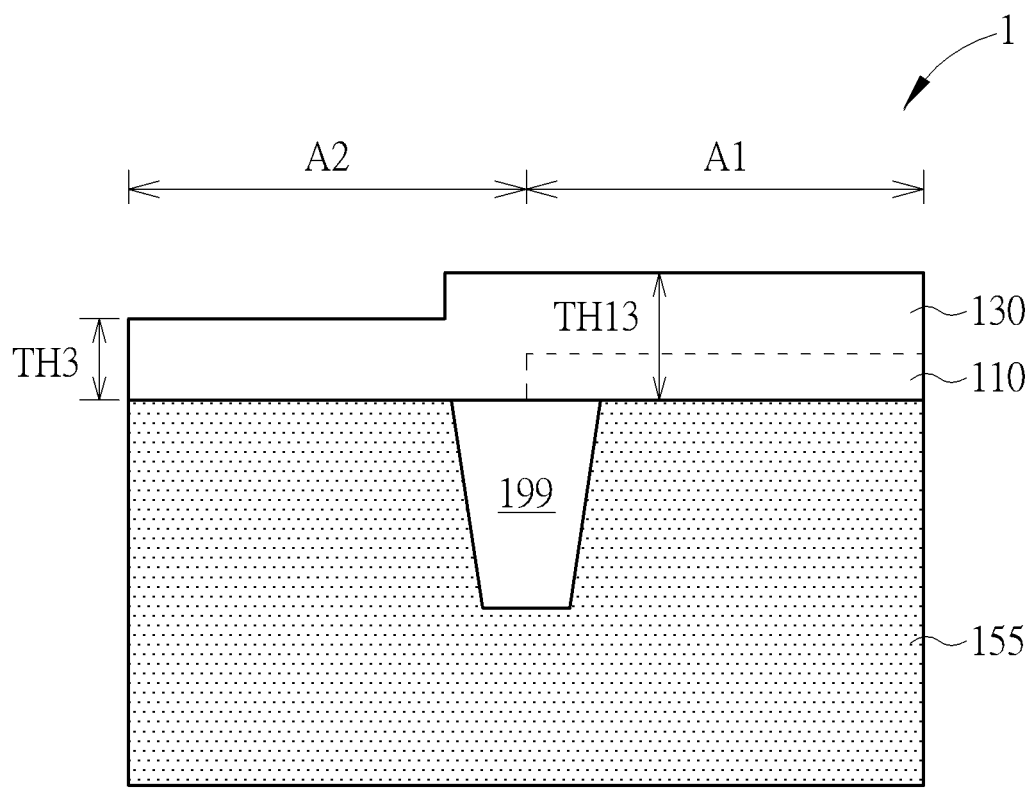

Regarding Step S160 and FIG. 9, the second oxidation process may include one of a physical vapor deposition (PVD) process, a chemical vapor deposition (CVD) process, a plasma-enhanced chemical vapor deposition (PECVD) process and a thermal oxidation process.

The third dielectric layer 130 as shown in FIG. 9 formed in Step S160 may include an oxidation layer.

Regarding Step S165, the logic device may include an input/output (TO) device. For example, the IO device may be operated with a 2.5-volt operation voltage or a 1.8-volt operation voltage.

In FIG. 9, in the first area A1, when the second oxidation process includes a deposition process, the third dielectric layer 130 may also be formed on top of the first dielectric layer 110 in the first area A1. The third dielectric layer 130 formed on the first dielectric layer 110 may be merged with the first dielectric layer 110 to increase the thickness of the first dielectric layer to the thickness TH13.

In another example, when the second oxidation process includes a thermal process, the newly generated oxide may be formed from the bottom of the first dielectric layer 110 in the first area A1 to increase the thickness of the first dielectric layer to the thickness TH13.

In FIG. 9, the dotted line is used to distinguish an original dielectric layer 110 (as shown in FIG. 8) and a newly generated dielectric layer formed in Step S160. However, the dotted line is merely used for explaining the manufacture process. As described above, the original dielectric layer 110 (as shown in FIG. 8) may be merged with the newly generated dielectric layer to form a thicker dielectric layer, and there may not be a clear boundary between the original dielectric layer 110 and the newly generated dielectric layer.

As shown in FIG. 9, the thickness TH3 of the third dielectric layer 130 may be smaller than the thickness TH13 of the first part of the first dielectric layer 110 after performing the second oxidation process.

In FIG. 9, the thickness TH3 of the third dielectric layer 130 may be adequate for a gate oxide layer of the logic device such as an IO device.

In FIG. 9, the thickness TH13 of the first part of the first dielectric layer 110 may be adequate for a floating gate oxide layer of a memory device such as a non-volatile memory device.

For example, the thickness TH3 may be 50 Å to 60 Å, and the thickness TH13 may be 80 Å to 110 Å.

By retaining the first part of the first dielectric layer 110 as shown in FIG. 7 and performing the oxidation process shown in FIG. 9, the dielectric layer in the first area A1 may be thicker than the dielectric layer in the first area A2 as shown in FIG. 9.

Since the oxidation process of Step S130 may be performed before forming the logic device, the features of the logic device may be less affected. As shown in FIG. 9, a memory device formed in the first area A1 may have a thicker dielectric layer than that of a logic device formed in the second area A2.

In summary, a method provided by an embodiment is useful for separately and properly controlling the thicknesses of dielectric layers of a memory device and a logic device so as to reduce problems in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor structure, the method comprising:
   forming a first dielectric layer on a substrate;
   forming a second dielectric layer on the first dielectric layer;
   using a photomask to apply a photoresist to cover a first part of the second dielectric layer in a first area;
   removing a second part of the second dielectric layer in a second area while retaining the first part of the second dielectric layer and retaining the first dielectric layer in the first area and the second area; and
   removing the photoresist;
   performing a first oxidation process to increase a thickness of a second part of the first dielectric layer, wherein a thickness of a first part of the first dielectric layer is substantially maintained;
   removing the second part of the first dielectric layer while retaining the first part of the first dielectric layer, wherein the first part of the first dielectric layer is covered by the first part of the second dielectric layer, and the removed second part of the first dielectric layer is with an increased thickness after the first oxidation process is performed;
   wherein the first part of the second dielectric layer covers the first part of the first dielectric layer in the first area, the second part of the second dielectric layer covers the second part of the first dielectric layer in the second area, the first area is corresponding to a memory device formed with the first dielectric layer, the memory device does not include any portion of the second dielectric layer, and the second area is corresponding to a logic device.

2. The method of claim 1, wherein the first oxidation process comprises one of a physical vapor deposition process, a chemical vapor deposition process, a plasma-enhanced chemical vapor deposition process and a thermal oxidation process.

3. The method of claim 1, further comprising:
   implanting ions through the second part of the first dielectric layer into the substrate to form a plurality of wells;
   wherein the second part of the first dielectric layer in the second area is with the increased thickness after the first oxidation process is performed.

4. The method of claim 3, further comprising:
   performing a logic fabrication process to form the logic device in the second area.

5. The method of claim 1, further comprising:
   removing the first part of the second dielectric layer; and
   performing a second oxidation process to form a third dielectric layer in the second area and increase the thickness of the first part of the first dielectric layer.

6. The method of claim 5, wherein the second oxidation process comprises one of a physical vapor deposition process, a chemical vapor deposition process, a plasma-enhanced chemical vapor deposition process and a thermal oxidation process.

7. The method of claim 5, wherein a thickness of the third dielectric layer is smaller than the thickness of the first part of the first dielectric layer after performing the second oxidation process.

8. The method of claim 5, wherein the third dielectric layer comprises an oxidation layer.

9. The method of claim 1, wherein the first dielectric layer comprises a sacrificial oxide layer.

10. The method of claim 1, wherein the second dielectric layer comprises a silicon nitride layer.

11. The method of claim 1, wherein an original thickness of the first dielectric layer is less than 100 Å.

12. The method of claim 1, wherein the logic device comprises an input/output (TIO) device.

* * * * *